(12) United States Patent
Jakschik et al.

(10) Patent No.: US 7,132,337 B2
(45) Date of Patent: Nov. 7, 2006

(54) CHARGE-TRAPPING MEMORY DEVICE AND METHOD OF PRODUCTION

(75) Inventors: Stefan Jakschik, Dresden (DE); Matthias Goldbach, Dresden (DE); Thomas Mikolajick, Dresden (DE); Thomas Hecht, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/017,194

(22) Filed: Dec. 20, 2004

(65) Prior Publication Data

US 2006/0134871 A1    Jun. 22, 2006

(51) Int. Cl.
*H01L 21/336* (2006.01)
(52) U.S. Cl. .................................................. 438/288
(58) Field of Classification Search ................ 438/287, 438/288
See application file for complete search history.

(56) References Cited

U.S. PATENT DOCUMENTS

| | | | |
|---|---|---|---|
| 5,768,192 A | | 6/1998 | Eitan |
| 5,777,364 A | * | 7/1998 | Crabbe et al. ............... 257/347 |
| 6,011,725 A | | 1/2000 | Eitan |
| 6,037,627 A | * | 3/2000 | Kitamura et al. ........... 257/324 |
| 6,312,999 B1 | * | 11/2001 | Chivukula et al. .......... 438/303 |
| 6,335,554 B1 | | 1/2002 | Yoshikawa |
| 6,632,714 B1 | * | 10/2003 | Yoshikawa .................. 438/258 |
| 6,639,271 B1 | | 10/2003 | Zheng et al. |
| 6,673,677 B1 | | 1/2004 | Hofmann et al. |
| 6,750,103 B1 | * | 6/2004 | Higashitani et al. ......... 438/261 |
| 2001/0024860 A1 | * | 9/2001 | Park et al. ................... 438/287 |
| 2002/0000623 A1 | * | 1/2002 | Cho et al. .................... 257/388 |
| 2003/0080372 A1 | | 5/2003 | Mikolajick |
| 2004/0004859 A1 | * | 1/2004 | Forbes et al. ........... 365/185.05 |
| 2004/0097037 A1 | | 5/2004 | Hofmann et al. |
| 2004/0183106 A1 | | 9/2004 | Kim et al. |
| 2005/0014335 A1 | | 1/2005 | Goldbach et al. |
| 2005/0104117 A1 | | 5/2005 | Mikolajick et al. |
| 2005/0269648 A1 | * | 12/2005 | Basceri et al. ............... 257/410 |
| 2006/0001075 A1 | * | 1/2006 | Shih ............................ 257/315 |

FOREIGN PATENT DOCUMENTS

| | | |
|---|---|---|
| DE | 100 36 911 A1 | 2/2002 |
| DE | 101 43 384 A1 | 5/2003 |

OTHER PUBLICATIONS

Eitan, B., et al., "NROM: A Novel Localized Trapping, 2-Bit Nonvolatile Memory Cell," IEEE Electron Device Letters, vol. 21, No. 11, Nov. 2000, pp. 543-545.

* cited by examiner

*Primary Examiner*—Lex H. Malsawma
(74) *Attorney, Agent, or Firm*—Slater & Matsil, L.L.P.

(57) ABSTRACT

Charge-trapping regions are arranged beneath lower edges of the gate electrode separate from one another. Source/drain regions are formed in self-aligned manner with respect to the charge-trapping regions by means of a doping process at low energy in order to form shallow junctions laterally extending only a small distance beneath the charge-trapping regions. The self-alignment ensures a large number of program-erase cycles with high effectiveness and good data retention, because the locations of the injections of charge carriers of opposite signs are narrowly and exactly defined.

18 Claims, 2 Drawing Sheets

CHARGE-TRAPPING MEMORY DEVICE AND METHOD OF PRODUCTION

TECHNICAL FIELD

This invention concerns charge-trapping memory devices comprising memory cells that are provided for the storage of two bits of information and a corresponding production method.

BACKGROUND

Nonvolatile memory cells that are electrically programmable and erasable can be realized as charge-trapping memory cells, which comprise a memory layer sequence of dielectric materials with a memory layer between confinement layers of dielectric material having a larger energy band gap than the memory layer. The memory layer sequence is arranged between a channel region within a semiconductor body and a gate electrode provided to control the channel by means of an applied electric voltage. Examples of charge-trapping memory cells are the SONOS memory cells, in which each confinement layer is an oxide and the memory layer is a nitride of the semiconductor material, usually silicon (U.S. Pat. No. 5,768,192 and U.S. Pat. No. 6,011,725, both of which are incorporated herein by reference).

Charge carriers are accelerated from source to drain through the channel region and gain enough energy to be able to penetrate the lower confinement layer and to be trapped within the memory layer. The trapped charge carriers change the threshold voltage of the cell transistor structure. Different programming states can be read by applying the appropriate reading voltages.

A publication by B. Eitan et al., "NROM: a Novel Localized Trapping, 2-Bit Nonvolatile Memory Cell" in IEEE Electron Device Letters, volume 21, pages 543 to 545 (2000), incorporated herein by reference, describes a charge-trapping memory cell with a memory layer sequence of oxide, nitride and oxide which is especially adapted to be operated with a reading voltage that is reverse to the programming voltage (reverse read). The oxide-nitride-oxide layer sequence is especially designed to avoid the direct tunneling regime and to guarantee the vertical retention of the trapped charge carriers. The oxide layers are specified to have a thickness of more than 5 nm.

The memory layer can be substituted with another dielectric material, provided the energy band gap is smaller than the energy band gap of the confinement layers. The difference in the energy band gaps should be as great as possible to secure a good charge carrier confinement and thus a good data retention. When using silicon dioxide as confinement layers, the memory layer may be tantalum oxide, cadmium silicate, titanium oxide, zirconium oxide or aluminum oxide. Also intrinsically conducting (non-doped) silicon may be used as the material of the memory layer.

The memory layer sequence of a charge-trapping memory cell is composed of dielectric materials. Therefore, it is possible to subdivide the memory layer into separate regions located at the source/drain regions of the memory cell transistor (for example U.S. Pat. No. 6,335,554 B1, incorporated herein by reference). In this way, it is possible to store two bits of information by an application of programming currents in two opposite directions. The function of the source region and the drain region is interchanged so that channel hot electrons are alternatively injected into one of the two separate memory layer regions. The programmed status of the memory cell can be read for the two charge-trapping regions separately. Thus, two bits of information can be stored separately in each transistor memory cell. The stored information is maintained for more than ten years if the memory layer and confinement layers are produced accordingly.

The amount of charge carriers which are trapped in the course of the programming process is not strictly fixed. Therefore, the threshold voltage of the cell transistor may display certain variations so that the actually sensed value deviates from the average value. The distributions of the threshold voltages of the programmed "0" and the programmed "1" should be as narrow as possible and should especially not overlap too much. Ideally, a complete separation of the ranges of the values of the threshold voltages for the two different programmed states is realized so that they do not overlap at all. To obtain this, the relative position of the charge-trapping regions and the adjacent junction of the corresponding source/drain region is critical.

SUMMARY OF THE INVENTION

In one aspect, the present invention provides a charge-trapping memory device for two-bit storage which is suitable for a large number of program-erase cycles. Further aspects include spatially stable charge carrier distribution in the programmed state and an improved compensation of trapped charges in an erase operation.

In still a further aspect, the invention provides a production method for a charge-trapping memory device comprising the inventive features.

The charge-trapping memory device according to this invention comprises two separate charge-trapping regions which are formed by parts of a memory layer composed of a material which is suitable for charge-trapping, especially one of the materials listed above. The charge-trapping regions are preferably formed of silicon nitride or aluminum oxide, which has been supplied with sufficient charge-trapping sites. The source/drain regions are formed with shallow junctions in a self-aligned fashion so that the lateral, essentially vertical sections of the junctions are located in the immediate vicinity of said charge-trapping regions.

The production method comprises the steps of forming separate charge-trapping regions of a dielectric material suitable for charge-trapping adjacent to the lower opposite edges of the gate electrode. Between the charge-trapping regions, a gate dielectric, preferably silicon oxide, is arranged. The charge-trapping regions are preferably formed by means of ALD (atomic layer deposition). In the case of the application of $Al_2O_3$ as charge-trapping dielectric, preferably trimethylaluminum (TMA) and water are supplied alternatingly.

Confinement layers of dielectric material may be arranged around the charge-trapping regions in order to improve the retention of stored charge carriers within these regions. In this way, especially a standard oxide-nitride-oxide memory layer sequence can be provided.

A doping process is performed by which the source/drain regions are formed in a manner which is self-aligned with respect to the charge-trapping regions. To this end, the doping is performed by a process chosen from the group consisting of gas phase doping, deposition of doped material and subsequent drive-in of the doping atoms, and ultra-low energy plasma doping. In contrast to standard implantation methods, these methods of doping are appropriate to form a doping profile with shallow depth so that the source/drain junctions are located only slightly beneath the main surface of the substrate carrying the gate electrode. This shallow doping enables a self-aligned formation of the source/drain regions, because the dopant does not diffuse into the channel region to a larger extent, which is unavoidable with standard deep implantations.

Preferred embodiments of the memory device comprise a junction depth which is at most equal to the dimension of the charge-trapping regions measured in a longitudinal direction along the channel connecting the source/drain regions. The charge-trapping regions may each have a dimension in the longitudinal direction of at most 20 nm. The junction depth may especially be at most equal to twice the thickness of the gate dielectric. In this way, a good localization of the trapped charges and an appropriate focusing of the oppositely charged carriers in the erasing process are obtained.

These and other features and advantages of the invention will become apparent from the following brief description of the drawings, detailed description and appended claims and drawings.

BRIEF DESCRIPTION OF THE DRAWINGS

Preferred examples of the charge-trapping memory device according to the invention an appropriate production method will be further described in detail in connection with the appended figures.

The following list of reference symbols can be used in conjunction with the figures:

| | |
|---|---|
| 1 | substrate |
| 2 | gate electrode |
| 3 | gate dielectric |
| 4 | memory layer |
| 5 | charge-trapping region |
| 6 | source/drain region |
| 7 | lateral junction |
| 8 | sidewall spacer |
| d | distance |

DETAILED DESCRIPTION OF ILLUSTRATIVE EMBODIMENTS

Figure 1:
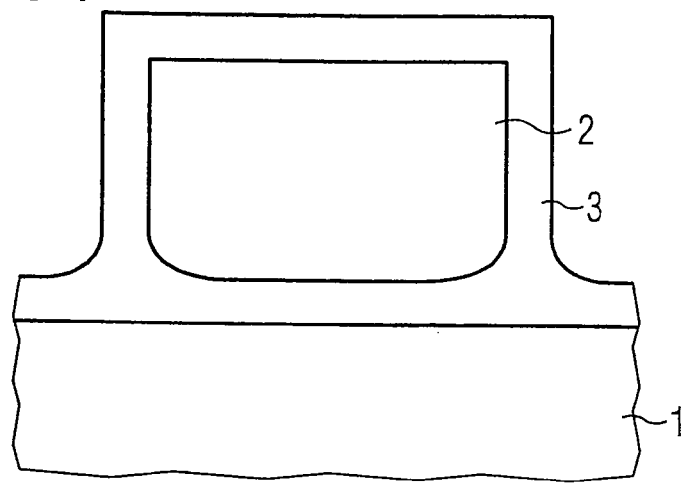
FIG. 1 shows a cross-section through an intermediate product of the production method after the application of the gate electrode and gate dielectric.

Preferred embodiments and examples of the charge-trapping memory device according to embodiments of this invention are now described in detail, following production steps of an especially suited process sequence. FIG. 1 shows a first intermediate product in cross-section, comprising a semiconductor body or substrate 1, preferably of silicon, having a main surface. Above this surface, a gate electrode 2, for example of polysilicon, is arranged, which can comprise rounded lower edges so that the space between the gate electrode and the substrate has a tapered shape, which opens towards the flanks of the gate electrode. A gate dielectric 3, preferably silicon oxide, is arranged between the gate electrode 2 and the substrate 1 and then removed in order to form recesses beneath the opposite lateral edges of the gate electrode 2.

Figure 2:
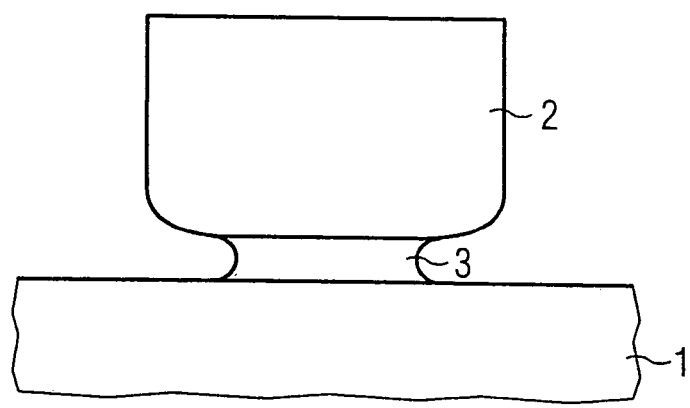
FIG. 2 shows the cross-section according to FIG. 1 after the formation of lateral recesses between the gate electrode and the substrate.

FIG. 2 shows the result of this process step in the cross-section according to FIG. 1. The material of the gate dielectric 3 is restricted to a remaining part shown in FIG. 2, and preferably all of the material of the gate dielectric is removed from the sidewalls and upper surface of the gate electrode 2. Then an interface layer 9 provided as confinement layer, for instance $SiO_2$ or $Si_3N_4$, may be applied to improve the retention of the charge that will be stored in the charge-trapping regions to be provided.

Figure 3:
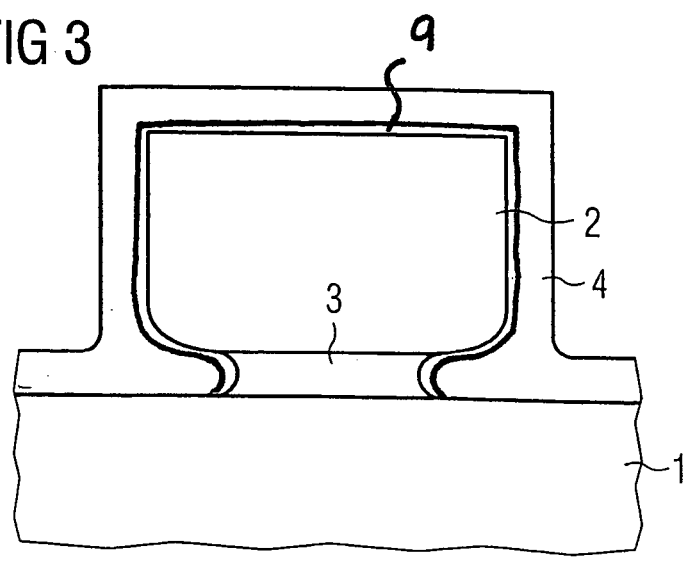
FIG. 3 shows the cross-section according to FIG. 2 after the application of a memory layer.

FIG. 3 shows the cross-section according to FIG. 2 after the application of a memory layer 4 of dielectric material suitable for the trapping of charge carriers in the course of a programming process. This material can be any material which is used as a charge-trapping material, especially $Si_3N_4$ or $Al_2O_3$. It is preferably deposited by means of ALD (atomic layer deposition) or CVD (chemical vapor deposition). $Al_2O_3$ has a sufficient trapping site density if the deposition is performed in an appropriate way. The application of ALD makes use of oxygen precursors, which are supplied alternatingly with a source of aluminum atoms. Preferably, trimethylaluminum (TMA) and ozone or water are supplied. The application of water as oxygen precursor has proven to render especially good charge-trapping regions of $Al_2O_3$. Trapping densities well above $10^{19}$ cm$^{-3}$ can be achieved if water is used as oxygen precursor.

Figure 4:
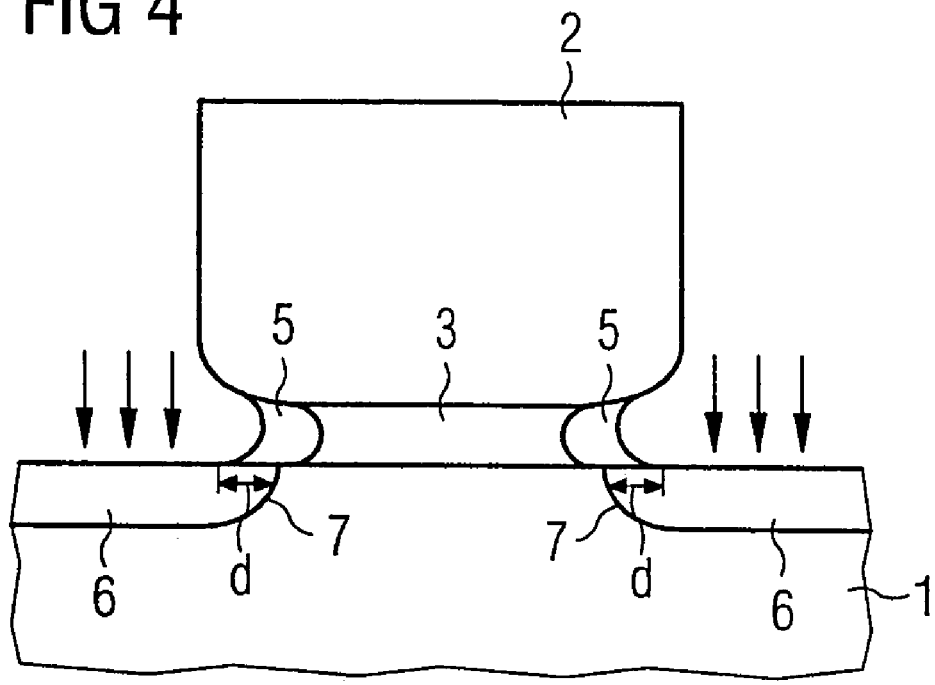
FIG. 4 shows the cross-section according to FIG. 3 after the restriction of the memory layer to charge-trapping regions and-the formation of source/drain regions.

FIG. 4 shows the cross-section according to FIG. 3 after the restriction of the memory layer 4 to two separate charge-trapping regions 5 that are located beneath the opposite lower edges of the gate electrode 2. It has already been mentioned that the material of the charge-trapping regions 5 can preferably be surrounded by a confinement layer, especially of silicon oxide, which is deposited before the deposition of the memory layer 4. The dimension of the charge-trapping regions 5 in the direction of the channel, i. e., from left to right within the drawing plane in FIG. 4, is preferably at most equal to 20 nm.

The subsequent formation of the source/drain regions 6 is performed by an introduction of doping atoms essentially in the direction of the arrows in FIG. 4 so that a shallow lower junction of the source/drain regions is obtained. This results in source/drain regions 6 which laterally extend only slightly beneath the charge-trapping regions 5 by a small distance d between the lateral junctions 7 and the outer limits of the charge-trapping regions 5 as indicated in FIG. 4. An n-doping of the source/drain regions by means of gas phase doping is obtained, for example, by the use of arsine ($AsH_3$). Instead, a doped material like $SiO_2$ can be deposited adjacent to the charge-trapping regions 5 on the semiconductor material so that the doping atoms can be introduced into the semiconductor material by the application of high temperature. After the dopant has been driven in, the doped material is removed from the surface of the substrate. The doping process is in any case performed in such a way that the material of the charge-trapping regions 5 functions as a barrier against the diffusion of the doping atoms. Thus, the lateral extension of the source/drain regions 6 beneath the charge-trapping regions 5 is only small in spite of the weak focusing of the doping atoms due to the small applied energies. The anisotropy of the doping process results from the masking effect of the adjacent charge-trapping regions 5. This allows for a self-aligned formation with only very small overlap of the junctions with the trapping material even for very small trapping regions of dimensions of less than 20 nm.

Figure 5:
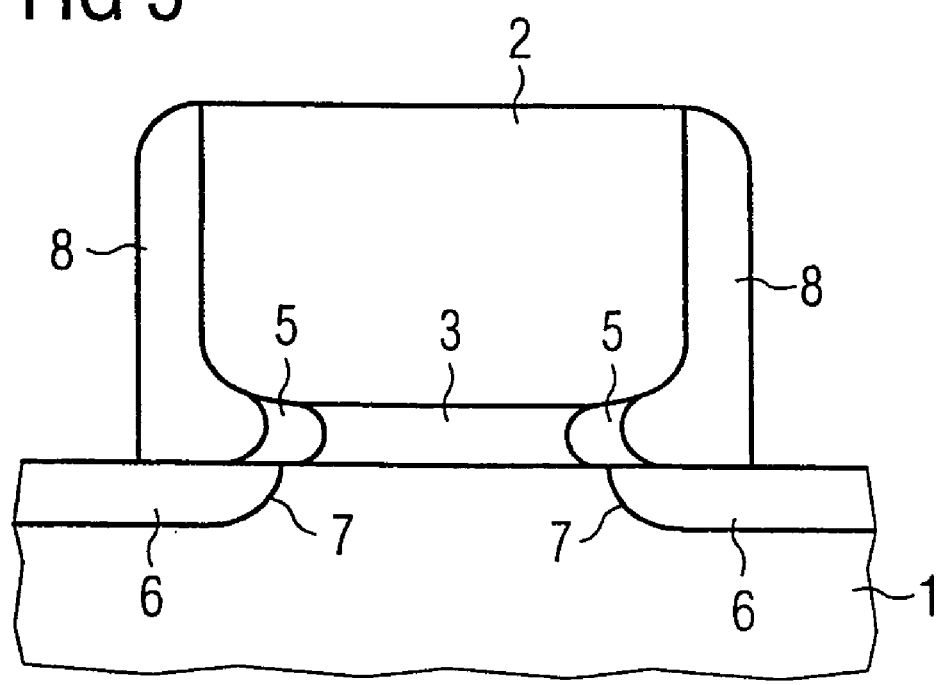
FIG. 5 shows the cross-section according to FIG. 4 after the application of lateral spacers.

FIG. 5 shows the cross-section according to FIG. 4 after the application of sidewall spacers 8, preferably composed of silicon oxide, which insulate the sidewalls of the gate electrode 2 and form a further confinement to the charge-trapping regions 5. The spacers 8 further serve to define the distance between source/drain contacts and the gate electrode 2.

Although the present invention and its advantages have been described in detail, it should be understood that various changes, substitutions and alterations can be made herein without departing from the spirit and scope of the invention as defined by the appended claims.

The invention claimed is:

1. A method for producing charge-trapping memory devices, the method comprising:
   providing a semiconductor body having a main surface;
   arranging a gate electrode having opposite lateral edges above said main surface and forming an electrically insulating gate dielectric between said gate electrode and the semiconductor body;
   etching said gate dielectric to form recesses at opposite lateral edges of said gate electrode;
   applying a memory layer of dielectric material suitable for charge-trapping;
   removing said memory layer except for limited charge-trapping regions that are located in said recesses and that extend from said gate dielectric for a distance that is short of said lateral edges such that the outer limits of said charge-trapping regions are recessed with respect to said lateral edges; and
   forming doped source/drain regions by an introduction of a dopant into the semiconductor body at said main surface in a self-aligned fashion with respect to said charge-trapping regions and wherein said introduction of said dopant comprises a process selected from the group consisting of gas phase doping, deposition of a doped layer followed by a thermal diffusion of the dopant, and plasma doping at low energy.

2. The method as claimed in claim 1, further comprising:
   applying confinement layers of dielectric material into said recesses before the deposition of said memory layer in order to improve a retention of stored charge carriers within the charge-trapping regions.

3. The method as claimed in claim 1, wherein said charge-trapping regions each having a dimension in a longitudinal direction along a line connecting said source/drain regions of at most 20 nm.

4. A method for producing charge-trapping memory devices, the method comprising:
   providing a semiconductor body having a main surface;
   arranging a gate electrode having opposite lateral edges above said main surface and forming an electrically insulating gate dielectric between said gate electrode and the semiconductor body;
   etching said gate dielectric to form recesses at opposite lateral edges of said gate electrode;
   applying a memory layer of $Al_2O_3$ dielectric material suitable for charge-trapping by means of atomic layer deposition form alternating trimethyaluminum and water;
   removing said memory layer except for limited charge-trapping regions that are located in said recesses and that extend from said gate dielectric for a distance that is short of said lateral edges such that the outer limits of said charge trapping regions are recessed with respect to said lateral edges; and
   forming doped source/drain regions by an introduction of a dopant into the semiconductor body at said main surface in a self-aligned fashion with respect to said charge-trapping regions and wherein said introduction of said dopant comprises a process selected from the group consisting of gas phase doping, deposition of a doped layer followed by a thermal diffusion of the dopant, and plasma doping at low energy.

5. A method for producing charge-trapping memory devices, the method comprising:
   providing a semiconductor body having a main surface;
   arranging a gate electrode having opposite lateral edges above said main surface and forming an electrically insulating gate dielectric between said gate electrode and the semiconductor body;
   etching said gate dielectric to form recesses at opposite lateral edges of said gate electrode;
   applying confinement layers of dielectric material into said recesses to improve retention of stored charge carriers within charge trapping region;
   applying a memory layer of dielectric material suitable for charge-trapping after applying said confinement layers;
   removing said memory layer except for limited charge-trapping regions that are located in said recesses and that extend from said gate dielectric for a distance that is short of said lateral edges such that the outer limits of said charge trapping regions are recessed with respect to said lateral edges; and
   forming doped source/drain regions by an introduction of a dopant into the semiconductor body at said main surface in a self-aligned fashion with respect to said charge-trapping regions and wherein said introduction of said dopant comprises a process selected from the group consisting of gas phase doping, deposition of a doped layer followed by a thermal diffusion of the dopant, and plasma doping at low energy.

6. A method for producing charge-trapping memory devices, the method comprising:
   providing a semiconductor body having a main surface;
   arranging a gate electrode having opposite lateral edges above said main surface and forming an electrically insulating gate dielectric between said gate electrode and the semiconductor body;
   etching said gate dielectric to form recesses at opposite lateral edges of said gate electrode;
   applying a memory layer of dielectric material suitable for charge-trapping;
   removing said memory layer except for limited charge-trapping regions that are located in said recesses and that extend from said gate dielectric for a distance that is short of said lateral edges such that the outer limits of said charge trapping regions are recessed with respect to said lateral edges, said charge trapping region having a dimension in a longitudinal direction along a line connecting said source/drain regions no greater than 20 nm; and
   forming doped source/drain regions by an introduction of a dopant into the semiconductor body at said main surface in a self-aligned fashion with respect to said charge-trapping regions and wherein said introduction of said dopant comprises a process selected from the group consisting of gas phase doping, deposition of a doped layer followed by a thermal diffusion of the dopant, and plasma doping at low energy.

7. A method for producing charge-trapping memory devices, the method comprising:
provoiding a semiconductor body having a main surface;
arranging a gate electrode having opposite lateral edges above said main surface and forming an electrically insulating gate dielectric between said gate electrode and the semiconductor body;
etching said gate dielectric to form recesses at opposite lateral edges of said gate electrode;
applying a memory layer of $Al_2O_3$ dielectric material suitable for charge-trapping by means of atomic layer deposition (ALD);
removing said memory layer except for limited charge-trapping regions that are located in said recesses and that extend from said gate dielectric for a distance that is short of said lateral edges such that the outer limits of said charge trapping regions are recessed with respect to said lateral edges; and
forming doped source/drain regions by an introduction of a dopant into the semiconductor body at said main surface in, a self-aligned fashion with respect to said charge-trapping regions.

8. The method as claimed in claim 7, wherein applying a memory layer of $Al_2O_3$ by means of atomic layer deposition comprises alternatingly depositing trimethylaluminum and water.

9. A method for producing charge-trapping memory devices, comprising:
providing a semiconductor body having a main surface;
forming an electrically insulating gate dielectric over and in contact with said main surface of said semiconductor body;
forming a gate electrode having opposite lateral edges over and in contact with said gate dielectric;
etching all of said gate dielectric between said gate electrode and the main surface of the semiconductor body for a selected distance extending from opposite lateral edges of said gate electrode to form recesses on each side of said gate electrode and an intermediate portion of said electrically insulating gate dielectric;
partially filling said recesses with a memory layer of dielectric material extending from said gate dielectric to outer limits short of said lateral edges such that said dielectric material is recessed with respect to said lateral edges, said dielectric material forming regions for charge trapping;
forming doped source/drain regions by an introduction of a dopant into the semiconductor body at said main surface in a self aligned fashion with respect to said charge-trapping regions.

10. The method as claimed in claim 9, wherein forming doped source/drain regions comprises performing said introduction of said dopant by means of a process selected from the group consisting of gas phase doping, deposition of a doped layer followed by a thermal diffusion of the dopant, and plasma doping at low energy.

11. The method as claimed in claim 10 wherein partially filling said recesses with a memory layer comprises applying a memory layer of $Al_2O_3$ by means of atomic layer deposition from alternating trimethyaluminum and water.

12. Tie method as claimed in claim 10, flier comprising:
applying confinement layers of dielectric material into said recesses before partially filling said recess with a memory layer in order to improve a retention of stored charge carriers within the charge-trapping regions.

13. The method as claimed in claim 10, wherein said charge-trapping regions each having a dimension in a longitudinal direction along a line connecting said source/drain regions of at most 20 nm.

14. The method as claimed in claim 9 wherein partially filling said recess with a memory layer comprises applying a memory layer of $Al_2O_3$ by means of atomic layer deposition.

15. The method as claimed in claim 14, wherein applying a memory layer comprises applying a memory layer of $Al_2O_3$ by means of atomic layer deposition from alternatingly trimethyaluminum and water.

16. The method as claimed in claim 9, further comprising:
applying confinement layers of dielectric material into said recesses before partially filling said recess with a memory layer in order to improve a retention of stored charge carriers within the charge-trapping regions.

17. The method as claimed in claim 9, wherein said charge-trapping regions each having a dimension in a longitudinal direction along a line connecting said source/drain regions of at most 20 nm.

18. The method of claim 9 wherein said step of providing an electrically insulating gate dielectric comprises providing a single layer of gate dielectric material.

* * * * *

UNITED STATES PATENT AND TRADEMARK OFFICE
CERTIFICATE OF CORRECTION

| | | |
|---|---|---|
| PATENT NO. | : 7,132,337 B2 | Page 1 of 1 |
| APPLICATION NO. | : 11/017194 | |
| DATED | : November 7, 2006 | |
| INVENTOR(S) | : Jakschik et al. | |

It is certified that error appears in the above-identified patent and that said Letters Patent is hereby corrected as shown below:

On Title Page
Item 56 in References Cited; delete "DE 101 43 384 A1 5/2003" and insert --DE 101 53 384 A1 5/2003--
Column 3, line 37; delete "and-the" and insert --and the--
Column 4, line 19; delete "$Si_3$" insert --$Si_3N_4$--
Column 4, line 20; delete "$N_4$"
Column 4, line 20; delete "$Al_2\ O_3$" insert --$Al_2O_3$--
Column 7, line 21; delete "in," insert --in--
Column 8, line 15; delete "Tie" insert --The--
Column 8, line 15; delete "flier" insert --further--

Signed and Sealed this

Sixth Day of March, 2007

JON W. DUDAS
*Director of the United States Patent and Trademark Office*